United States Patent
Wu et al.

(10) Patent No.: US 9,287,437 B2
(45) Date of Patent: Mar. 15, 2016

(54) APPARATUS AND METHOD FOR MONITORING THE PROCESS OF FABRICATING SOLAR CELLS

(71) Applicant: TSMC Solar Ltd., Taichung (TW)

(72) Inventors: Chung-Hsien Wu, Luzhou Township (TW); Hung-Yu Chang, Taipei (TW)

(73) Assignee: TSMC Solar Ltd., Taichung (TW)

( * ) Notice: Subject to any disclaimer, the term of this patent is extended or adjusted under 35 U.S.C. 154(b) by 0 days.

(21) Appl. No.: 14/173,838

(22) Filed: Feb. 6, 2014

(65) Prior Publication Data
US 2015/0221808 A1     Aug. 6, 2015

(51) Int. Cl.
*H01L 21/66*     (2006.01)
*H01L 31/18*     (2006.01)
*H01L 21/02*     (2006.01)

(52) U.S. Cl.
CPC ......... *H01L 31/1836* (2013.01); *H01L 21/0262* (2013.01); *H01L 21/02557* (2013.01)

(58) Field of Classification Search
CPC ......... H01L 22/34; H01L 22/14; H01L 22/32; H01L 22/12
USPC ......... 438/18, 22; 156/345; 136/252
See application file for complete search history.

(56) References Cited

U.S. PATENT DOCUMENTS 5,336,356 A *   8/1994   Ban et al. ............. 156/345.26
2008/0128019 A1 * 6/2008 Lopatin et al. ............ 136/252

* cited by examiner

*Primary Examiner* — Quoc Hoang
(74) *Attorney, Agent, or Firm* — Duane Morris LLP

(57) ABSTRACT

A method for monitoring the process of fabricating solar cells generally comprises performing a reaction process in a chamber for a solar cell substructure, wherein the chamber includes a reaction solution that includes at least one chemical component. A concentration value is detected for the chemical component during the reaction process, via a detection assembly that is coupled to the chamber. The method further includes determining whether the detected concentration value is at a predefined threshold concentration level or within a predefined concentration range for the chemical component, via a control assembly that is coupled to the detection assembly. The concentration of the chemical component within the reaction solution is modified, during the reaction process, when the detected concentration value is different from the predefined threshold concentration level or different from the predefined concentration range.

20 Claims, 4 Drawing Sheets

APPARATUS AND METHOD FOR MONITORING THE PROCESS OF FABRICATING SOLAR CELLS

BACKGROUND

This disclosure relates to thin film photovoltaic solar cells. Photovoltaic cells or solar cells are photovoltaic components for direct generation of electrical current from sunlight. Due to the growing demand for clean sources of energy, the manufacture of solar cells has expanded dramatically in recent years and continues to expand. Solar cells include a substrate, a back contact layer on the substrate, an absorber layer on the back contact layer, a buffer layer on the absorber layer, and a front contact layer above the buffer layer. The layers can be applied onto the substrate during various deposition processes.

The buffer layer can serve two functions that include (1) providing an n-type semi-conductive layer and (2) reducing a shunt current. As such, the buffer layer can include a metal chalcogenide, such as cadmium sulphide (CdS) and zinc sulphide (ZnS), in chalcopyrite (CIGS) and kesterite (CZTS) solar cells. The metal chalcogenide thin films can be prepared by a chemical bath deposition (CBD) process in a deposition tank or chamber. The CBD process includes using a reaction solution that includes thiourea and ammonia mixed with a metal sulfate, such as cadmium sulfate (CdSO4) or zinc sulfate (ZnSO4), a metal nitrile, or a metal chloride in distilled water at a temperature range of from about 50 to about 90 degrees Celsius.

During the CBD process, the concentration values of the various chemical components of the reaction solution can change and some residual compounds can form. For example, sodium or other elements can slightly dissolve from the chalcopyrite absorber during the CBD process. These elements will accumulate and, as a result, the concentration values of various chemical components in the reaction solution can increase. Accordingly, after a CBD process has completed for one substructure, the chemicals are drained out from the deposition chamber and new chemicals are added prior to the commencement of another CBD process for a different substructure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
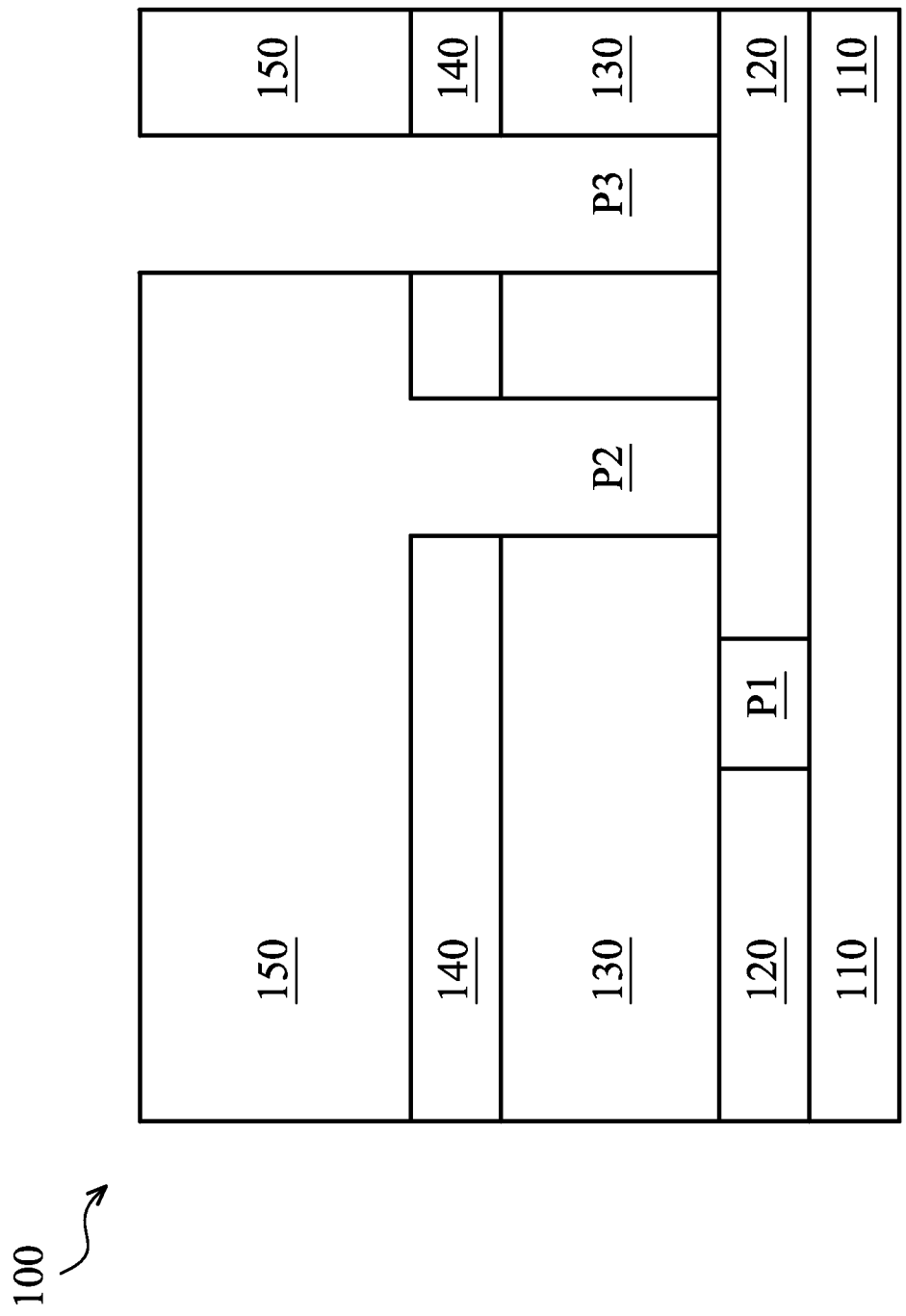
FIG. 1 is a cross-sectional view of an exemplary solar cell, in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly As described above, during a chemical bath deposition (CBD) process for the fabrication of a solar cell and/or a solar cell substructure, the concentration of various chemical components of a reaction solution used for the CBD process can change and some residual compounds can form. For example, small amounts of sodium or other elements can dissolve from a chalcopyrite absorber used during the CBD process. These elements will accumulate and, as a result, the concentration of various chemical components can increase. Such an increase or any other change to the concentration of the various chemical components can cause the deposition rate to decrease and the quality of the buffer layer to be diminished. As such, after the CBD process for one solar cell substructure is complete, the chemical components are drained out from the deposition chamber and new chemicals are added prior to the next deposition process. This approach can inhibit concentration changes of the chemical components during the next deposition process. However, this approach can be time consuming and can require a large consumption of high quantity of chemicals. Accordingly, this approach is not very efficient and/or cost effective.

The exemplary system, apparatus, and method described herein enable an efficient and/or cost effective approach to a CBD process for the fabrication of a solar cell and/or solar cell substructure. For example, some embodiments provide a monitoring apparatus for a solar cell fabrication system. The monitoring apparatus is configured to detect the concentration of various chemical components of a reaction solution used for the CBD process and/or the pH of the reaction solution during the CBD process. The monitoring apparatus is further configured to adjust the concentration of the chemical components and/or the pH of the reaction solution during the deposition process when the detected values of the concentration of the chemical components and/or the pH levels are not at or within respective predefined threshold levels or ranges. As such, the concentration of the various chemical components in the reaction solution and/or the pH of the reaction solution are maintained at optimal levels during the CBD process. This approach can extend the lifetime of the chemical bath. As such, the chemical bath for the reaction solution does not need to be drained and new chemicals do not need to be added between each different CBD processing operation.

FIG. 1 illustrates a cross-section of a solar cell 100. Solar cell 100 includes a substrate 110, a back contact layer 120 formed onto substrate 110, an absorber layer 130 formed onto back contact layer 120, a buffer layer 140 formed onto absorber layer 130, and a front contact layer (also referred to as a transparent conductive oxide (TCO) layer) 150 above buffer layer 140.

Substrate 110 can include any suitable substrate material, such as glass. In some embodiments, substrate 110 can include a glass substrate, such as soda lime glass, or a flexible metal foil or polymer (e.g., a polyimide, polyethylene terephthalate (PET), polyethylene naphthalene (PEN)). Other embodiments include still other substrate materials.

Back contact layer 120 includes any suitable back contact material, such as metals. In some embodiments, back contact layer 120 can include molybdenum (Mo), platinum (Pt), gold (Au), silver (Ag), nickel (Ni), or copper (Cu). Other embodiments include still other back contact materials.

In some embodiments, absorber layer 130 includes any suitable absorber material, such as p-type semiconductors. In some embodiments, the absorber layer 130 can include a chalcopyrite-based material comprising, for example, Cu(In,Ga)Se2 (CIGS), cadmium telluride (CdTe), CuInSe2 (CIS), CuGaSe2 (CGS), Cu(In,Ga)Se2 (CIGS), Cu(In,Ga)(Se,S)2 (CIGSS), CdTe or amorphous silicon. Other embodiments include still other absorber materials.

Buffer layer 140 includes any suitable buffer material, such as n-type semiconductors. In some embodiments, buffer layer 140 can include cadmium sulphide (CdS), zinc sulphide (ZnS), zinc selenide (ZnSe), indium(III) sulfide (In2S3), indium selenide (In2Se3), or Zn1-xMgxO, (e.g., ZnO). Other embodiments include still other buffer materials.

In some embodiments, front contact layer 150 includes an annealed TCO layer. The TCO material for the annealed TCO layer can include any suitable front contact material, such as metal oxides and metal oxide precursors. In some embodiments, the TCO material can include zinc oxide (ZnO), cadmium oxide (CdO), indium oxide (In2O3), tin dioxide (SnO2), tantalum pentoxide (Ta2O5), gallium indium oxide (GaInO3), (CdSb2O3), or indium oxide (ITO). The TCO material can also be doped with a suitable dopant. In some embodiments, ZnO can be doped with any of aluminum (Al), gallium (Ga), boron (B), indium (In), yttrium (Y), scandium (Sc), fluorine (F), vanadium (V), silicon (Si), germanium (Ge), titanium (Ti), zirconium (Zr), hafnium (Hf), magnesium (Mg), arsenic (As), or hydrogen (H). In other embodiments, SnO2 can be doped with antimony (Sb), F, As, niobium (Nb), or tantalum (Ta). In other embodiments, In2O3 can be doped with tin (Sn), Mo, Ta, tungsten (W), Zr, F, Ge, Nb, Hf, or Mg. In other embodiments, CdO can be doped with In or Sn. In other embodiments, GaInO3 can be doped with Sn or Ge. In other embodiments, CdSb2O3 can be doped with Y. In other embodiments, ITO can be doped with Sn. Other embodiments include still other TCO materials and corresponding dopants.

Solar cell 100 also includes interconnect structures that include three scribe lines, referred to as P1, P2, and P3. The P1 scribe line extends through the back contact layer 120 and is filled with the absorber layer material. The P2 scribe line extends through the buffer layer 140 and the absorber layer 130 and is filled with the front contact layer material. The P3 scribe line extends through the front contact layer 150, buffer layer 140 and absorber layer 130.

Figure 2:
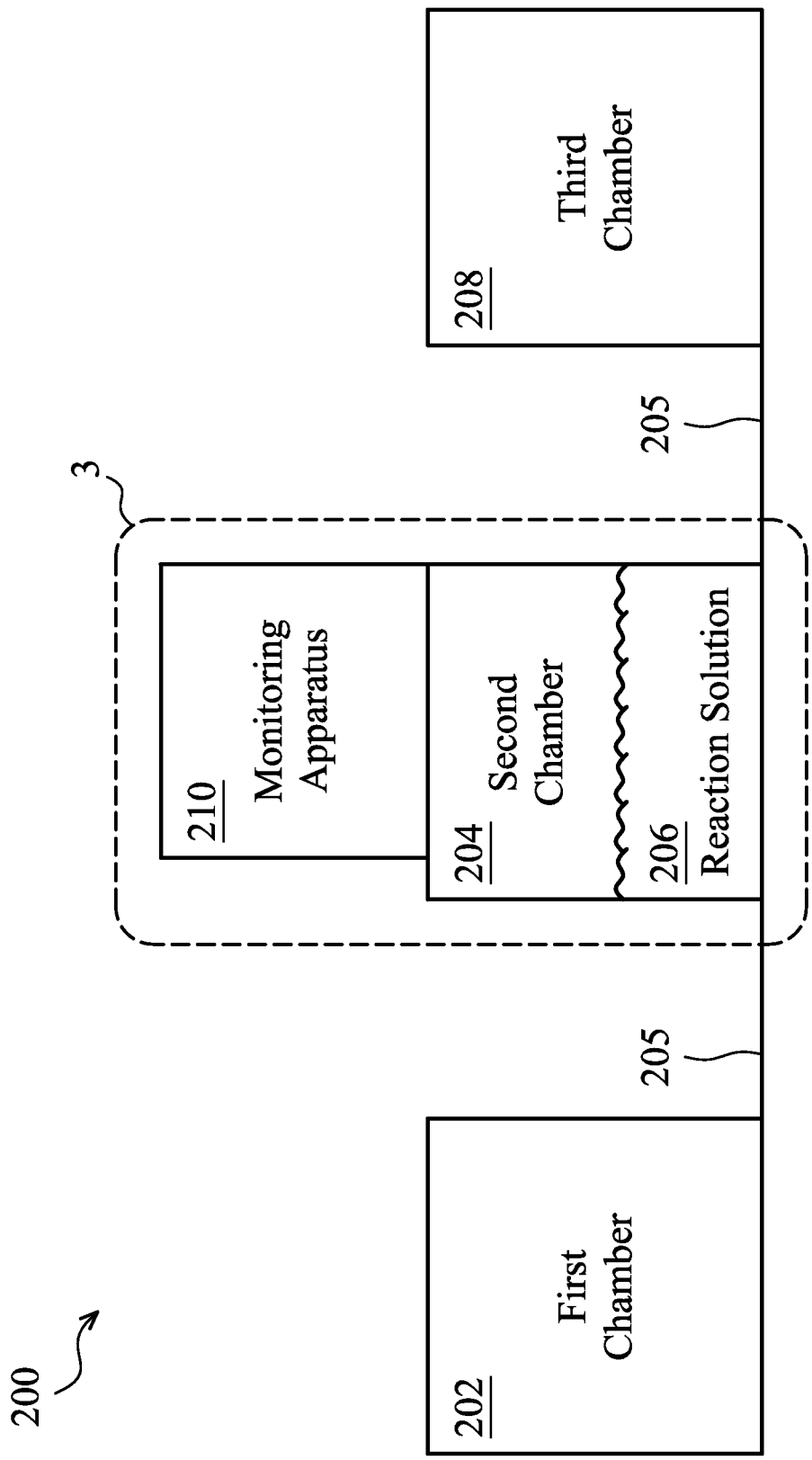
FIG. 2 is a block diagram of an exemplary solar cell fabrication system used for fabricating the solar cell shown in FIG. 1, in accordance with some embodiments.

FIG. 2 is a block diagram of an exemplary solar cell fabrication system 200 used for the fabrication of solar cell 100 (shown in FIG. 1). In some embodiments, system 200 includes at least one first chamber 202 that is configured to receive a substrate, such as substrate 110 (shown in FIG. 1), and to prepare substrate 110 therein for further processing. For example, first chamber 202 can include a vacuum source (not shown), a heater (not shown), and/or a heat exchanger (not shown) to facilitate providing heat energy to substrate 110, such that substrate is heated and ready to undergo further processing. The at least one first chamber 202 can include two or more chambers for performing different processes such as, but not limited to, sputtering, chemical vapor deposition (CVD) or atomic layer deposition (ALD). A second chamber 204 is coupled to first chamber 202, via, for example, an endless conveyor 205, and second chamber 204 is configured to receive substrate 110 from first chamber 202 via endless conveyor 205.

In some embodiments, second chamber 204 is configured to deposit a layer, such as buffer layer 140 (shown in FIG. 1), onto substrate 110 to form solar cell 100 or a substructure of solar cell 100. As such, second chamber 204 can include, for example, CBD equipment (not shown), such as a heater (not shown). The CBD equipment can facilitate, for example, the formation of the metal chalcogenide thin films of buffer layer 140. In some embodiments, second chamber 204 has reaction solution 206 contained therein.

Reaction solution 206 contains at least one chemical component or element that facilitate the CBD process. For example, during the CBD process one or more of the chemical reactions outlined below in Equations 1 through 5 can occur.

$$CdSO_4 \rightarrow Cd^{2+} + SO_4^{2-} \qquad \text{Equation 1}$$

$$NH_4^+ + OH^- \rightarrow NH_3 + H_2O \qquad \text{Equation 2}$$

$$Cd^{2+} + 4NH_3 \rightarrow [Cd(NH_3)_4]^{2+} + 2OH^- \qquad \text{Equation 3}$$

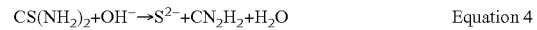

$$CS(NH_2)_2 + OH^- \rightarrow S^{2-} + CN_2H_2 + H_2O \qquad \text{Equation 4}$$

$$[Cd(NH_3)_4]^{2+} + S^{2-} \rightarrow CdS + 4NH_3 \qquad \text{Equation 5}$$

These chemical reactions are performed at temperatures of about 50 degrees Celsius to about 90 degrees Celsius for about 5 minutes to 90 minutes. Moreover, the reaction results in separate chemical components or elements having positively and negatively charged ion(s). As such, reaction solution 206 has positively and negatively charged ion(s) contained therein. Any variation or changes in the concentration of the various chemical components or elements can alter the amount of positively and negatively charged ions within reaction solution 206 and/or change the pH of reaction solution 206.

In some embodiments, system 200 also includes a third chamber 208 that is coupled to second chamber 204 via endless conveyor 205. In some embodiments, third chamber 208 is configured to conduct a post-processing of the formed substructure, such as completing the formation of the precursor layer or buffer layer 140. For example, third chamber 208 can also include inert gases, such as nitrogen gas, argon, and helium, as well as hydrogen selenide and hydrogen sulfide such that third chamber 208 can conduct a selenization process and a sulfurization process after the selenization process (SAS).

A monitoring apparatus 210 is coupled to second chamber 204 and, in some embodiments, can be positioned proximate to chamber 204. As will be explained in more detail with respect to FIGS. 3 and 4, monitoring apparatus 210 is configured to monitor reaction solution 210 continuously during the CBD process to ensure that chemical concentration level(s) and pH level(s) remain at optimal levels for the CBD process. For example, in some embodiments, monitoring apparatus 210 is configured to detect the concentration values of the various chemical components and elements of reaction solution 206 and/or detect the pH of reaction solution 206 during the CBD process. In some embodiments, monitoring apparatus 210 is further configured to adjust the concentration levels of the chemical components within reaction solution 206 and/or the pH of reaction solution 206 during the deposition process when the detected concentration values of the chemical components and/or the detected pH are not at or within a respective predefined threshold level or range. As such, the concentration of the various chemical components of reaction solution 206 and/or the pH of reaction solution 206 are maintained at optimal levels during the CBD process.

Figure 3:
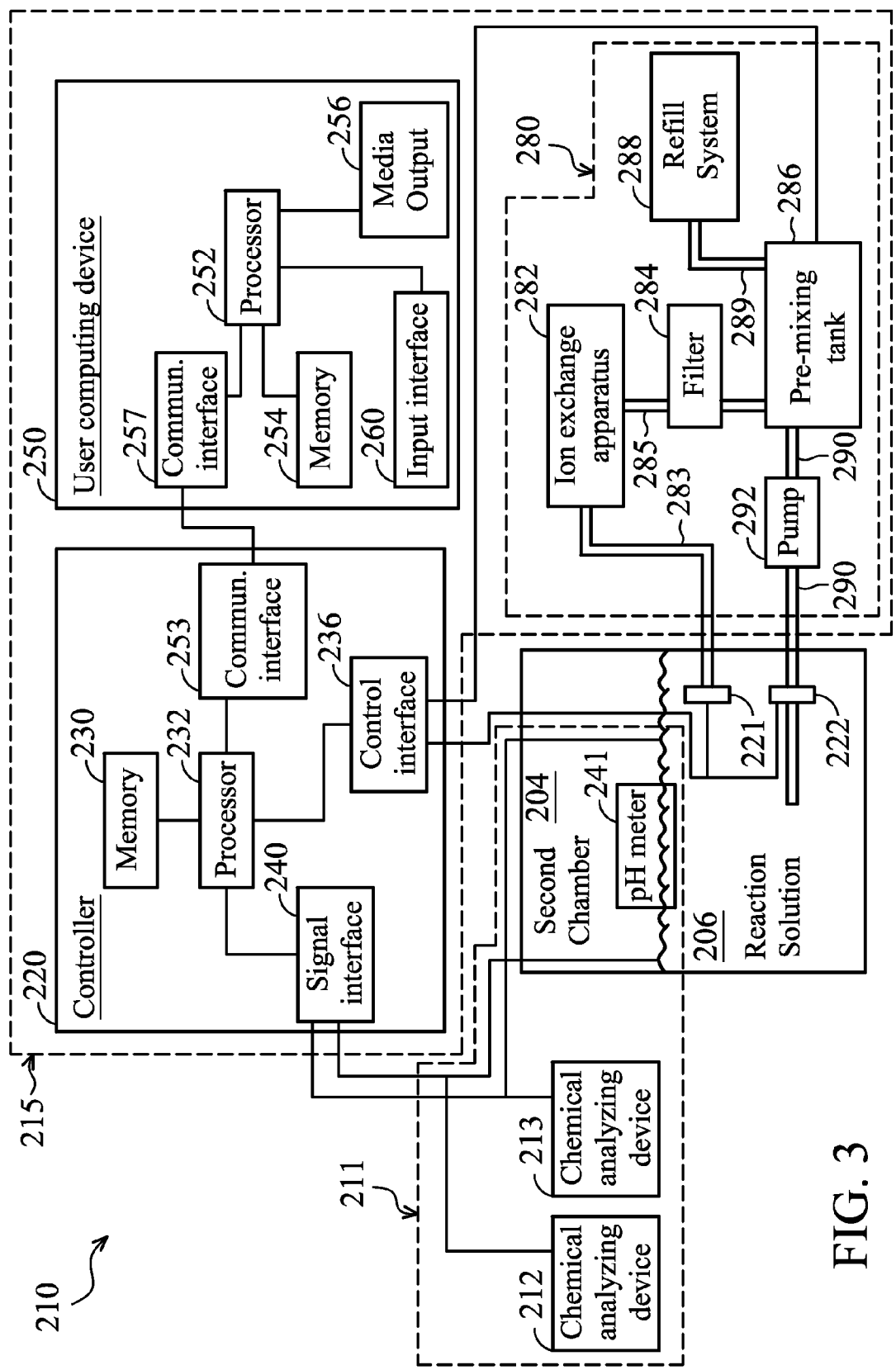
FIG. 3 is a block diagram of an exemplary monitoring apparatus used with the solar cell fabrication system shown in FIG. 2 and taken from area 3, in accordance with some embodiments.

FIG. 3 illustrates monitoring apparatus 210 that is coupled to chamber 204 taken from area 3 (shown in FIG. 2). Monitoring apparatus 210, in some embodiments, includes a detection assembly 211 that is coupled to at least a portion of chamber 204 and detection assembly 211 is configured to detect a concentration value of at least one chemical component in reaction solution 206, during the CBD process. For example, in some embodiments, detection assembly 211 includes at least two chemical analyzing devices 212 and 213 that are each configured to detect the concentration values of each of the chemical components (ions) contained within reaction solution 206, such as the concentration values of $Cd^{2+}$, $Zn^{2+}$, $S^{2-}$, $NH4^+$, $Na^+$, $Cu^+$, $In^{3+}$, $Ga^{3+}$, $Se^{2-}$, $SO4^{2-}$, and/or $CN_2H_2$. In some embodiments, chemical analyzing devices 212 and 213 each include a titrator (not shown) that are each configured to perform a titration to detect or determine the concentrations values. In other embodiments, chemical analyzing devices 212 and 213 each include an inductively coupled plasma-mass spectrometry apparatus (not shown) or an inductively coupled plasma-atomic emission spectroscopy apparatus (not shown) to detect or determine the concentration values. In some embodiments, chemical analyzing devices 212 and 213 can also each include an atomic absorption spectrometry apparatus (not shown) to detect or determine the concentration values.

In some embodiments, detection assembly 211 also includes a pH meter 214 that is positioned within chamber 204 such that pH meter 214 is positioned at least partially within reaction solution 206. In some embodiments, pH meter 214 is configured to determine the pH level of reaction solution 206 during the CBD process.

In some embodiments, monitoring apparatus 210 also includes a control assembly or system 215 that is coupled to detection assembly 211 and to chamber 204. In some embodiments, as explained in more detail below with respect to FIG. 4, control assembly 215 is configured to determine whether the concentration values detected by chemical analyzing devices 212 and 213 and/or the pH values detected by pH meter 214 are at or within a respective predefined threshold level. Control assembly 215 is also configured to initiate modification of the concentrations of the chemical components within reaction solution 206 and/or the pH of reaction solution 206, during the CBD process, when the detected values are different from the respective predefined threshold level.

In some embodiments, control assembly 215 includes a controller 220 that is operatively coupled to vary the operation of chamber 204 as a function of values determined from detection assembly 211 according to a programmed control scheme or algorithm. For example, in some embodiments, controller 220 is coupled to control at least one valve, such as valves 221 and 222, in second chamber 204. In some embodiments, controller 220 is enabled to facilitate operative features of valves 221 and 222, via features that include, without limitation, receiving inputs, transmitting outputs, and transmitting opening and closing commands.

In some embodiments, controller 220 can be a real-time controller and can include any suitable processor-based or microprocessor-based system, such as a computer system, that includes microcontrollers, reduced instruction set computer (RISC), an embedded microprocessor, application-specific integrated circuits (ASICs), logic circuits, and/or any other circuit or processor that is capable of executing the functions described herein. In one embodiment, controller 220 can be a microprocessor that includes read-only memory (ROM) and/or random access memory (RAM), such as, for example, a 32 bit microcomputer with 2 Mbit ROM and 64 Kbit RAM. As used herein, the term "real-time" refers to outcomes occurring within a short period of time after a change in the inputs affect the outcome, with the time period being a design parameter that can be selected based on the importance of the outcome and/or the capability of the system processing the inputs to generate the outcome.

In some embodiments, controller 220 includes a memory device 230 that stores executable instructions and/or one or more operating parameters representing and/or indicating an operating condition of second chamber 204. Controller 220 also includes a processor 232 that is coupled to memory device 230 via a system bus 234. In some embodiments, processor 232 can include a processing unit, such as, without limitation, an integrated circuit (IC), an application specific integrated circuit (ASIC), a microcomputer, a programmable logic controller (PLC), and/or any other programmable circuit. Alternatively, processor 232 can include multiple processing units (e.g., in a multi-core configuration). The above examples are exemplary only, and thus are not intended to limit in any way the definition and/or meaning of the term "processor."

In some embodiments, controller 220 includes a control interface 236 that is coupled to second chamber 204. For example, control interface 236 is coupled to components, such as valve 221 and valve 222 within second chamber 204. Control interface 236 is also configured to control an operation of valves 221 and 222. For example, processor 232 can be programmed to generate one or more control parameters that are transmitted to control interface 236. Control interface 236 can then transmit a control signal to modulate, open, or close valves 221 and 222, for example.

Various connection protocols can be used for communications between control interface 236 and second chamber 204. Such connection protocols can include, without limitation, an electrical conductor, a low-level serial data connection, such as Recommended Standard (RS) 232 or RS-485, a high-level serial data connection, such as USB, a field bus, a "PROFI-BUS®," or Institute of Electrical and Electronics Engineers (IEEE) 1394 (a/k/a FIREWIRE), a parallel data connection, such as IEEE 1284 or IEEE 488, a short-range wireless communication channel (personal area network) such as "BLUE-TOOTH," and/or a private (e.g., inaccessible outside system) network connection, whether wired or wireless. "PROFI-BUS" is a registered trademark of Profibus Trade Organization of Scottsdale, Ariz. IEEE is a registered trademark of the Institute of Electrical and Electronics Engineers, Inc., of New York, N.Y. "BLUETOOTH" is a registered trademark of Bluetooth SIG, Inc. of Kirkland, Wash.

In some embodiments, controller 220 includes a signal interface 240 that is communicatively coupled to detection assembly 211. For example, signal interface 240 can be in communication with chemical analyzing devices 212 and 213 and with pH meter 214. As such, chemical analyzing devices 212 and 213 and pH meter 214 can transmit signals representative of the detected chemical concentrations and detected pH values, respectively, to controller 220. The signals can be transmitted continuously in some embodiments. In other embodiments, the signals can be transmitted periodically or only once, for example. In some embodiments, different bases are used for signal timings. Furthermore, the signals can be transmitted in either an analog form or in a digital form. Various connections are available between signal interface 240 and chemical analyzing devices 212 and 213 and pH meter 214. Such connections can include, without limitation, an electrical conductor, a low-level serial data connection, such as RS 232 or RS-485, a high-level serial data connection, such as USB or IEEE® 1394, a parallel data connection, such as IEEE® 1284 or IEEE® 488, a short-range wireless communication channel such as BLUETOOTH®, and/or a private (e.g., inaccessible outside system) network connection, whether wired or wireless.

Control assembly 215 can also include a user computing device 250 that is coupled to controller 220 and/or to detection assembly 211 via, for example, a network (not shown). For example, computing device 250 includes a communication interface 251 that is coupled to a communication interface 253 contained within controller 220. User computing device 250 includes a processor 252 for executing instructions. In some embodiments, executable instructions are stored in a memory device 254. Processor 252 can include one or more processing units (e.g., in a multi-core configuration). Memory device 254 is any device allowing information, such as executable instructions and/or other data, to be stored and retrieved. User computing device 250 also includes at least one media output component 256 for use in presenting information to a user. Media output component 256 is any component capable of conveying information to the user. Media output component 256 can include, without limitation, a display device (not shown) (e.g., a liquid crystal display (LCD), an organic light emitting diode (OLED) display, or an audio output device (e.g., a speaker or headphones)).

In some embodiments, user computing device 250 includes an input interface 260 for receiving input from a user. Input interface 260 can include, for example, a keyboard, a pointing device, a mouse, a stylus, a touch sensitive panel (e.g., a touch pad or a touch screen), a gyroscope, an accelerometer, a position detector, and/or an audio input device. A single component, such as a touch screen, can function as both an output device of media output component 256 and input interface 260.

In some embodiments, control assembly 215 includes a chemical concentration assembly 280 coupled to controller 220 and to second chamber 204. Chemical concentration assembly 280 includes an ion exchange apparatus 282 that is configured to perform ion exchange chromatography to facilitate removing chemical components (i.e., ions) from chamber 204. In some embodiments, ion exchange apparatus 282 can be coupled to valve 221 of chamber 204 via a conduit 283. Ion exchange apparatus 282 can also be coupled to a filter 284 via a conduit 285 that is coupled to a pre-mixing tank 286. Pre-mixing tank 286 can also be coupled to a chemical refill system 288 via conduit 289. As such, pre-mixing tank 286 is configured to receive filtered chemical components that can be mixed therein and channeled back to chamber 204. For example, in some embodiments, pre-mixing tank 286 is coupled to chamber 204 via a conduit 290. In some embodiments, a pump 292 can be coupled between chamber 204 and pre-mixing tank 286. Pump 292 can be positioned at least partially within conduit 290 to facilitate channeling the chemical mixture within pre-mixing tank 286 to chamber 204.

Prior to the operation of solar cell fabrication system 200 (shown in FIG. 2) and/or operation of monitoring apparatus 210, a user can input predefined threshold levels to computing device 250. The threshold levels can be the predefined threshold levels for the concentrations of the chemical components within reaction solution 206 and predefined threshold levels for the pH of reaction solution 206. The predefined concentration threshold levels and the predefined pH level can be based on levels that are optimal for performing the CBD process. For example, in some embodiments, the predefined chemical concentration threshold levels and the predefined pH threshold level can be the levels described in Table 1 below.

TABLE 1

| Predefined Threshold Values |
|---|
| $[Cd^{2+}]$ or $[Zn^{2+}]$ = 0.1 mM~1M |
| $[S^{2-}]$ = 0.1 mM~1M |
| $[NH_4^+]$ = 0.2M~5M |
| $[Na^+]$, $[Cu^+]$, $[In^{3+}]$, $[Ga^{3+}]$, $[Se^{2-}]$ <0.1 mM |
| $[SO_4^{2-}]$ < 1M |
| $[CN_2H_2]$ < 1M |
| PH = 10~13 |

During operation, substrate 110 is delivered from first chamber 202, via endless conveyor 205, wherein substrate 110 is heated in preparation for further processing, to second chamber 204 such that layer(s), such as buffer layer 140 (shown in FIG. 1) can be deposited onto substrate 110 via processes, such as the CBD process.

As explained in more detail below with respect to FIG. 4, during the CBD process, second chamber 204 is monitored by monitoring apparatus 210 to ensure that concentration levels for each of the chemical components within reaction solution 206 and the pH level for reaction solution 206 remain at and/or within the aforementioned predefined threshold levels. For example, in some embodiments, chemical analyzing devices 212 and 213 each detect the concentrations value of at least one of the chemical components in reaction solution. PH meter 214 also detects the pH level for reaction solution 206.

As explained in more detail below with respect to FIG. 4, after the concentration value(s) of the chemical component(s) and the pH level of reaction solution 206 are detected, signal(s) representative of the detected values are transmitted from chemical analyzing devices 212 and 213 and the pH meter 214, respectively, to controller 220. Controller 220 transmits the signal to computing device 250 such that computing device 250 determines whether the detected values are at or within the respective above-referenced predefined threshold levels. If the detected values are greater than or less than the respective predefined threshold levels, then computing device 250 transmits a signal to controller 220 to modify the concentration of the chemical components in reaction solution 206 and/or the pH level of reaction solution 206. As explained in more detail below with respect to FIG. 4, in some embodiments, controller 220 can transmit a control parameter to chamber 204 to facilitate removing or adding various chemical components into reaction solution 206 to adjust concentration levels of various chemical components in reaction solution 206 and/or to adjust the pH level of reaction solution 206.

Accordingly, the concentration of the chemical components and/or the pH levels are maintained at optimal levels during the CBD process. Maintaining the concentration levels and/or the pH levels can extend the lifetime of reaction solution 206 and reaction solution 206 can be used for the next CBD process for a different substrate. As such, reaction solution 206 does not need to be drained and new chemicals do not need to be added between different deposition processes.

Figure 4:
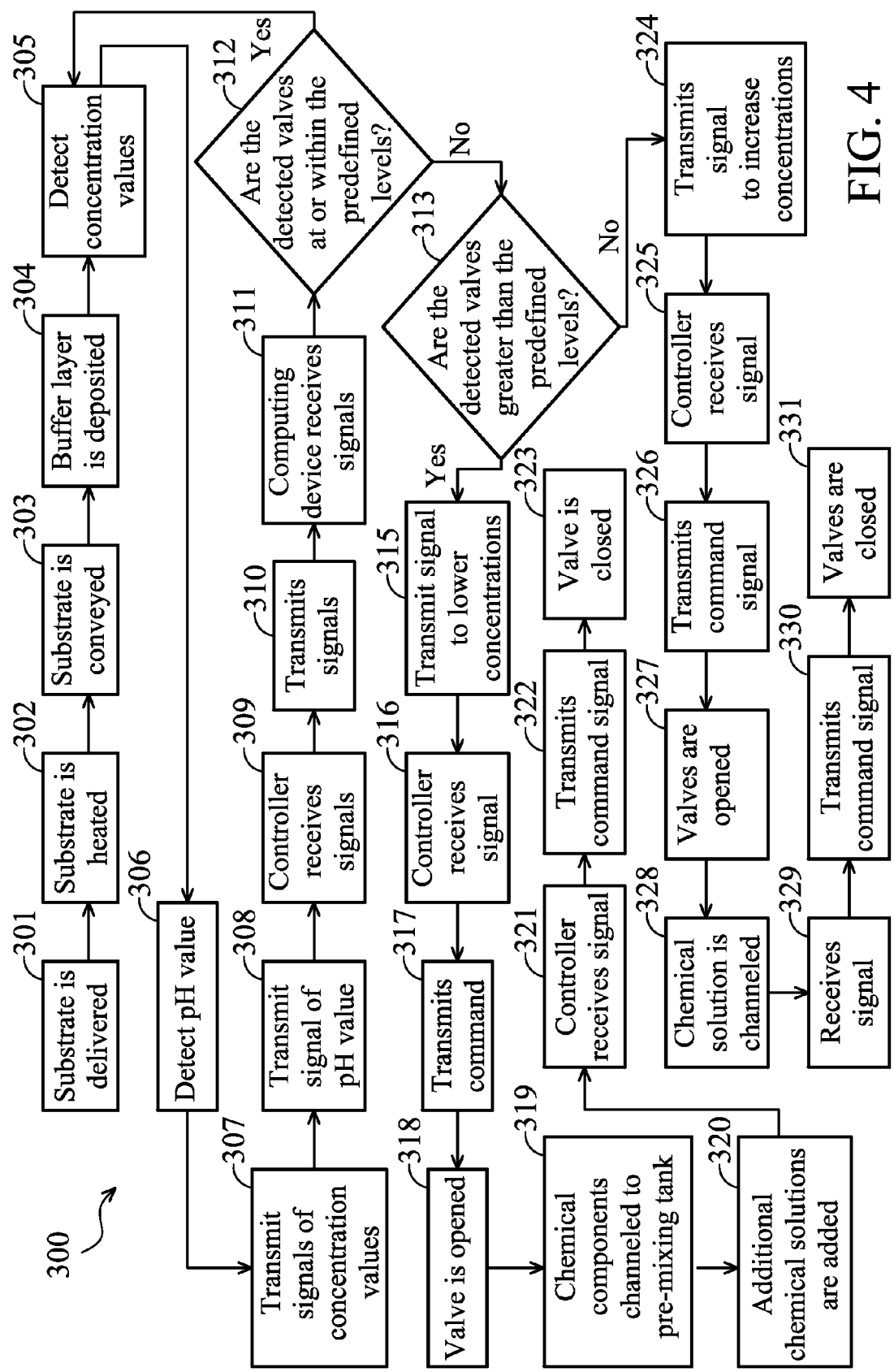
FIG. 4 is a flow diagram of an exemplary method for monitoring the process of fabricating the solar cell using the monitoring apparatus shown in FIG. 3, in accordance with some embodiments.

FIG. 4 is a flow diagram 300 of an exemplary method for monitoring the process for the fabrication of solar cell 100 (shown in FIG. 1) by using monitoring apparatus 210 (shown in FIGS. 2 and 3). In step 301, substrate 110 (shown in FIG. 1) is delivered to first chamber 202 (shown in FIG. 2), via endless conveyor 205 (shown in FIG. 2), wherein substrate 110 is heated in preparation for further processing in step 302. In some embodiments, steps 301 and 302 are optional and can be excluded from the method.

In step 303, substrate 110 is conveyed on endless conveyor 205 from first chamber 202 to second chamber 204 (shown in FIGS. 2 and 3). In step 304, buffer layer 140 (shown in FIG. 1) or a precursor layer is deposited onto substrate 110 or previous stack of layers on substrate 110 to form a substructure via processes, such as a CBD process.

During the CBD process, second chamber 204 is monitored by monitoring apparatus 210 (shown in FIGS. 2 and 3) to ensure that concentration levels for each of the chemical components within reaction solution 206 (shown in FIGS. 2 and 3) and the pH level for reaction solution 206 remain at and/or within the aforementioned predefined threshold levels (shown in Table 1). For example, in step 305, chemical analyzing devices 212 and 213 (shown in FIG. 3) each detect the concentration value of one or more chemical components in reaction solution 206, such as the chemical components identified above (shown in Table 1). For example, in some embodiments, one chemical analyzing device 212 can detect the concentration value(s) of a few of the chemical components of reaction solution 206 and the other chemical analyzing device 213 can detect the concentration values(s) of the remaining chemical components in reaction solution 206. In some embodiments, each chemical analyzing device 212 and 213 includes a titrator such that each chemical analyzing device 212 and 213 can perform a titration to determine the concentration values of the chemical components. In other embodiments, each chemical analyzing device 212 and 213 can use inductively coupled plasma-mass spectrometry or inductively coupled plasma-atomic emission spectroscopy to determine the concentration values. In some embodiments, each chemical analyzing device 212 and 213 can use atomic absorption spectrometry to determine the concentration values of the chemical components.

In some embodiments, chemical analyzing devices 212 and 213 can each detect the concentration values of the different chemical components continuously during the CBD process. In other embodiments, chemical analyzing devices 212 and 213 can detect the concentration values of the different chemical components periodically during the CBD process at various times that are programmed by a user via computing device 250 (shown in FIG. 3). In some embodiments, chemical analyzing devices 212 and 213 can each detect the concentration value of the different chemical components once during the CBD process.

As the chemical analyzing devices 212 and 213 are determining the concentration values of the chemical components within reaction solution 206, pH meter 214 detects the pH level for reaction solution 206 in step 306. In some embodiments, pH meter 214 detects the pH value of reaction solution 206 continuously during the CBD process. In other embodiments, pH meter 214 detects the pH value of reaction solution periodically during the CBD process at various times that are programmed by a user via computing device 250. In other embodiments, pH meter 214 can detect the pH value once during the CBD process.

In step 307, each chemical analyzing device 212 and 213 transmits signals representative of the detected concentration values of the respective chemical components to controller 220. Similarly, in step 308, pH meter 214 transmits a signal representative of the detected pH value(s) of reaction solution 206 to controller 220. In some embodiments, each chemical analyzing device 212 and 213 transmits the signals after each concentration value is detected. For example, if chemical analyzing devices 212 and 213 are each detecting concentration values continuously during the CBD process, then each device 212 and 213 will transmit signals of the detected concentration values continuously to controller 220 during the CBD process. Similarly, if pH meter 214 is detecting the pH value of reaction solution 206 continuously during the CBD process, then pH meter 214 will transmit signals of the detected pH values to controller 220 continuously to controller 220 during the CBD process.

Controller 220 receives the signals of the detected concentration values and the detected pH values in step 309 via signal interface 240 (shown in FIG. 3). In step 310, controller 220 transmits the signals to computing device 250 and, in step 311, computing device 250 receives the signals. In step 312, computing device 250 determines whether the detected values are at or within the above-referenced predefined threshold levels or ranges for the concentrations of the chemical components and the pH level. If the values are within or at the predefined threshold ranges or levels, then the CBD process continues with no further modifications to reaction solution 206 and steps 305 to 312 are repeated to continue the detection process.

If any one of the values of the concentrations and/or pH are not within or at the predefined threshold ranges or levels, then, in step 312, computing device 250 determines whether the detected values are either greater than or less than the predefined threshold levels in step 313. If the detected values are greater than the predefined threshold levels, then computing device 250 transmits a signal to controller 220 to reduce the concentrations of the chemical components that are higher than the predefined threshold levels and/or to reduce the pH level of reaction solution 206 in step 315.

Controller 220 receives the signal in step 316. In step 317, controller 220 transmits a command signal to chamber 204 and to chemical concentration assembly 280 (shown in FIG. 3), wherein the command signal facilitates the opening of valve 221 (shown in FIG. 3) in step 318 such that the chemical components at issue can be removed from chamber 204 and channeled through ion exchange apparatus 282 (shown in FIG. 3) via ion exchange chromatography. In step 319, the chemical components can be channeled through filter 284 (shown in FIG. 3) to pre-mixing tank 286 (shown in FIG. 3). In step 320, chemical refill system 288 (shown in FIG. 3) can add additional chemical solutions used for the CBD process to pre-mixing tank 286 such that the chemical solution can remain within pre-mixing tank 286 until the solution is needed in chamber 204 for reaction solution 206.

When the detected values of the chemical components in reaction solution 206 are identified as being at or within the predefined threshold levels or ranges during the continuous detection of the values and transmission of signals of the detected values as steps 305 to 312 above are repeated, then controller 220 transmits a different command signal to second chamber 204. For example, controller 220 receives a signal, in step 321, from computing device 250, wherein the signal indicates that the detected concentration values and/or detected pH values are now at or within the predefined threshold levels. In step 322, controller 220 transmits a command signal to chamber 204, wherein the command signal facilitates the closing of valve 221 in step 323 such that the chemical components are no longer being removed from chamber 204.

If, in step 313, computing device 250 determines that the detected values are less than the predefined threshold levels, then computing device 250 transmits a signal to controller 220 to increase the concentrations of the chemical components that are identified as being lower than the predefined threshold levels and/or to increase the pH level of reaction solution 206 in step 324. Controller 220 receives the signal in step 325. In step 326, controller 220 transmits a command signal to chamber 204 and to chemical concentration assembly 280, wherein the command signal facilitates the opening of valve 222 (shown in FIG. 3) and a valve (not shown) within pre-mixing tank 286 in step 327. In step 328, the chemical solution within pre-mixing tank 286 is channeled to chamber 204 via pump 292. In some embodiments, the chemical solution being channeled from pre-mixing tank 286 to chamber 204 includes cadmium sulfate, thiourea, and/or ammonium hydroxide.

When the detected values of the chemical components in reaction solution 206 are identified as being at or within the predefined threshold levels during the continuous detection of the values and transmission of the signals of the detected values as steps 305 to 312 above are repeated, then controller 220 transmits a different command signal to second chamber 204. For example, controller 220 receives a signal, in step 329, from computing device 250, wherein the signal indicates that the detected concentration values and/or detected pH values are now at or within the predefined threshold levels. In step 330, controller 220 transmits a command signal to chamber 204 and to pre-mixing tank 286, wherein the command signal facilitates the closing of valve 222 and the valve within pre-mixing tank 286 in step 331 such that the chemical compound within pre-mixing tank 286 is no longer being channeled to chamber 204.

In some embodiments, steps 305 to 331 are repeated continuously through the duration of the CBD process to ensure that the concentrations of the chemical components of reaction solution 206 and/or the pH levels of reaction solution 206 are maintained at optimal levels during the CBD process. Maintaining such optimal levels can extend the lifetime of reaction solution 206 such that reaction solution 206 can be used for the next CBD process for a different substrate. As such, reaction solution 206 does not need to be drained and new chemicals do not need to be added between different CBD processes.

Some embodiments described herein enable an efficient and/or cost effective approach to a CBD process used for the fabrication of a solar cell and/or solar cell substructure. For example, in some embodiments, a monitoring apparatus is provided that can be used with a solar cell fabrication system. The monitoring apparatus is configured to detect the concentration of various chemical components of a reaction solution used for the CBD process and/or the pH of the reaction solution during the CBD process. The monitoring apparatus is further configured to adjust the concentration of the chemical components and/or the pH of the reaction solution during the deposition process when the detected values of the concentration of the chemical components and/or the pH levels are not at or within respective predefined threshold levels. As such, the concentration of the various chemical components in the reaction solution and/or the pH of the reaction solution are maintained at optimal levels during the CBD process. This approach can extend the lifetime of the chemical bath. As such, the chemical bath for the reaction solution does not need to be drained and new chemicals do not need to be added between each different CBD process.

In some embodiments, a method for monitoring the process of fabricating solar cells is provided. The method includes performing a reaction process in a chamber for a solar cell substructure, wherein the chamber includes a reaction solution that includes at least one chemical component. A concentration value is detected for the chemical component during the reaction process, via a detection assembly that is coupled to the chamber. The method further includes determining whether the detected concentration value is at a predefined threshold concentration level or within a predefined concentration range for the chemical component, via a control assembly that is coupled to the detection assembly. The concentration of the chemical component within the reaction solution is modified, during the reaction process, when the detected concentration value is different from the predefined threshold concentration level or different from the predefined concentration range.

In some embodiments, a monitoring apparatus is provided. The monitoring apparatus includes a detection assembly that is configured to detect a concentration value of at least one chemical component in a reaction solution, during a reaction process being performed within a chamber for a solar cell substructure. A control assembly is coupled to the detection assembly, wherein the control assembly is configured to determine whether the detected concentration value is at a predefined threshold concentration level or within a predefined concentration range for the chemical component. The control assembly is further configured to modify the concentration of the chemical component within the reaction solution, during the reaction process, when the detected concentration value is different from the predefined threshold concentration level or different from the predefined concentration range.

In some embodiments, a solar cell fabrication system is provided. The solar cell fabrication system includes a chamber that is configured to receive a solar cell substructure from at least one other chamber and to perform a reaction process for the solar cell substructure. The chamber includes a reaction solution contained therein that includes at least one chemical component. A monitoring apparatus is coupled to the chamber, wherein the monitoring apparatus includes a detection assembly configured to detect a concentration value of the chemical component during the reaction process. A control assembly is coupled to the detection assembly, wherein the control assembly is configured to determine whether the detected concentration value is at a predefined threshold concentration level or within a predefined concentration range for the chemical component. The control assembly is further configured to modify the concentration of the chemical component within the reaction solution, during the reaction process, when the detected concentration value is different from the predefined threshold concentration level or different from the predefined concentration range.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein.

Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for monitoring the process of fabricating solar cells, said method comprising:
performing a reaction process in a chamber, including treating a solar cell substructure with a reaction liquid that includes at least one chemical component,
detecting a concentration value of the at least one chemical component in the chamber during the reaction process, via a detection assembly that is coupled to the chamber,
determining whether the detected concentration value in the chamber is at a predefined threshold concentration level or within a predefined concentration range for the at least one chemical component, via a control assembly coupled to the detection assembly
modifying the concentration of the at least one chemical component within the reaction liquid in pre-mixing tanks by adding chemical components or removing residual ions with an ion exchange in the pre-mixing tanks, during the reaction process, when the detected concentration value is different from the predefined threshold concentration level or different from the predefined concentration range;
sending the modified reaction liquid in the pre-mixing tanks into the chamber to maintain the concentration value within a predefined concentration range in the chambers.

2. The method of claim 1, wherein detecting a concentration value comprises performing a titration.

3. The method of claim 1, further comprising detecting a pH value of the reaction liquid during the reaction process, via a pH meter.

4. The method of claim 3, further comprising:
determining whether the detected pH value is at a predefined threshold pH level or within a predefined pH range for the reaction liquid, via the control assembly; and
modifying the concentration of the at least one chemical component within the reaction liquid, during the reaction process, when the detected pH value is different from the predefined threshold pH level or different from the predefined pH range.

5. The method of claim 1, wherein modifying the concentration of the at least one chemical component comprises removing at least a portion of the chemical component from the reaction liquid.

6. The method of claim 5, wherein removing at least a portion of the chemical component from the reaction liquid comprises using ion exchange chromatography.

7. The method of claim 1, wherein modifying the concentration of the at least one chemical component comprises adding a chemical compound to the reaction liquid, the chemical compound includes at least one of cadmium sulfate, thiourea, or ammonium hydroxide.

8. A monitoring apparatus comprising:
a detection assembly configured to detect a concentration value of at least one chemical component in a reaction liquid, during a reaction process being performed within a chamber for a solar cell substructure; and
a control assembly coupled to said detection assembly, wherein said control assembly is configured to:
determine whether the detected concentration value is at a predefined threshold concentration level or within a predefined concentration range for the at least one chemical component;
modify the concentration of the at least one chemical component within the reaction liquid in the chamber, during the reaction process, when the detected concentration value is different from the predefined threshold concentration level or different from the predefined concentration range;
adjust the concentration of the chemical component to the predefined range; and
return the reaction liquid back into the chamber.

9. The monitoring apparatus of claim 8, wherein said detection assembly comprises at least two titrators to enable said detection assembly to perform a titration to detect the concentration value of the at least one chemical component.

10. The monitoring apparatus of claim 8, wherein said detection assembly comprises a pH meter such that said detection assembly is further configured to detect a pH value of the reaction liquid during the reaction process.

11. The monitoring apparatus of claim 10, wherein said control assembly is further configured to:
determine whether the detected pH value is at a predefined threshold pH level or within a predefined pH range for the reaction liquid; and
modify the concentration of the at least one chemical component within the reaction liquid, during the reaction process, when the detected pH value is different from the predefined threshold pH level or different from the predefined pH range.

12. The monitoring apparatus of claim 8, wherein said control assembly is configured to modify the concentration of the at least one chemical component by being configured to remove at least a portion of the chemical component from the reaction liquid.

13. The monitoring apparatus of claim 12, wherein said control assembly is configured to use ion exchange chromatography for the removal of at least a portion of the chemical component from the reaction liquid.

14. The monitoring apparatus of claim 8, wherein said control assembly is configured to modify the concentration of the at least one chemical component by adding a chemical compound to the reaction liquid, and the chemical compound includes at least one of a cadmium sulfate, thiourea, or ammonium hydroxide.

15. A solar cell fabrication system comprising:
a plurality of chambers configured to receive a solar cell substructure and to perform a reaction process on the solar cell substructure,
wherein said chambers contains at least one reaction liquid that includes at least one chemical component; and
a monitoring apparatus coupled to said chambers, wherein said monitoring apparatus comprises:
a detection assembly configured to detect a concentration value of the at least one chemical component in at least one chamber during the reaction process, and
a control assembly coupled to said detection assembly, wherein said control assembly is configured to:
determine whether the detected concentration value is at a predefined threshold concentration level or within a predefined concentration range for the at least one chemical component; and
modify the concentration of the at least one chemical component within the reaction liquid that flows out of the chambers, during the reaction process, when the detected concentration value is different from the predefined threshold concentration level or different from the predefined concentration range;
pump the modified reaction liquid back into the corresponding chambers.

16. The solar cell fabrication system of claim 15, wherein said detection assembly comprises at least two titrators to enable said detection assembly to perform a titration to detect the concentration value of the at least one chemical component.

17. The solar cell fabrication system of claim 15, wherein said detection assembly comprises a pH meter such that said detection assembly is further configured to detect a pH value of the reaction liquid during the reaction process.

18. The solar cell fabrication system of claim 17, wherein said control assembly is further configured to:
   determine whether the detected pH value is at a predefined threshold pH level or within a predefined pH range for the reaction liquid; and
   modify the concentration of the at least one chemical component within the reaction liquid, during the reaction process, when the detected pH value is different from the predefined threshold pH level or different from the predefined pH range.

19. The solar cell fabrication system of claim 15, wherein said control assembly is configured to modify the concentration of the at least one chemical component by being configured to one of remove at least a portion of the chemical component from the reaction liquid or add a chemical compound to the reaction liquid, the chemical compound includes at least one of a cadmium sulfate, thiourea, or ammonium hydroxide.

20. The solar cell fabrication system of claim 19, wherein said control assembly is configured to use ion exchange chromatography for the removal of at least a portion of the chemical component from the reaction liquid.

* * * * *